(12) United States Patent
Li

(10) Patent No.: US 11,619,881 B2
(45) Date of Patent: Apr. 4, 2023

(54) METHOD FOR EXPOSING PHOTOPOLYMERIZATION LAYER COMPRISING PHOTOPOLYMER

(71) Applicant: Hui-ju Lee, New Taipei (TW)

(72) Inventor: Chia-Ming Li, New Taipei (TW)

(73) Assignee: Lee Hui-Ju, New Taipei (TW)

( * ) Notice: Subject to any disclaimer, the term of this patent is extended or adjusted under 35 U.S.C. 154(b) by 0 days.

(21) Appl. No.: 17/903,531

(22) Filed: Sep. 6, 2022

(65) Prior Publication Data

US 2023/0069972 A1 Mar. 9, 2023

(30) Foreign Application Priority Data

Sep. 8, 2021 (TW) .................................. 110133388

(51) Int. Cl.
*G03F 7/11* (2006.01)
*G03F 7/20* (2006.01)
*H05K 3/00* (2006.01)
*H01J 61/20* (2006.01)

(52) U.S. Cl.
CPC .............. *G03F 7/11* (2013.01); *G03F 7/2022* (2013.01); *H05K 3/00* (2013.01); *G03F 7/2016* (2013.01); *H01J 61/20* (2013.01)

(58) Field of Classification Search
CPC ........ G03F 7/11; G03F 7/2022; G03F 7/2016; H05K 3/00; H01J 61/20
USPC .................................................. 430/319, 311
See application file for complete search history.

(56) References Cited

U.S. PATENT DOCUMENTS

| 3,784,378 A * | 1/1974 | Gramas .................. G03F 7/2022 430/328 |
| 4,610,941 A * | 9/1986 | Sullivan .................... H05K 3/28 430/312 |
| 2016/0200042 A1* | 7/2016 | Jeng ....................... B29C 64/124 264/494 |
| 2017/0176852 A1* | 6/2017 | Wu ....................... C09D 133/14 |

FOREIGN PATENT DOCUMENTS

| CN | 106886127 A | 6/2017 |
| TW | 200612194 A | 4/2006 |
| TW | 200707122 A | 2/2007 |
| TW | 201625720 A | 7/2016 |

\* cited by examiner

*Primary Examiner* — Caleen O Sullivan
(74) *Attorney, Agent, or Firm* — Muncy, Geissler, Olds & Lowe, P.C.

(57) ABSTRACT

A method for exposing a photopolymerization layer comprising photopolymers includes: providing a printed circuit board, with a photopolymerization layer disposed on the top side of the printed circuit board; performing first-instance exposure on the photopolymerization layer, using a UV source and a digital micro-lens device, wherein the UV source is of a power less than 0.2 kW; stopping the first-instance exposure; covering the photopolymerization layer with a mask, with the mask having a bottom side in contact with the photopolymerization layer; and performing second-instance exposure on the photopolymerization layer, using a mercury lamp and the mask, wherein the mercury lamp is of a power greater than 5 kW.

5 Claims, 4 Drawing Sheets

METHOD FOR EXPOSING PHOTOPOLYMERIZATION LAYER COMPRISING PHOTOPOLYMER

BACKGROUND OF THE INVENTION

1. Technical Field

The present disclosure relates to the patterning processes for photopolymerization layers in printed circuit boards and, more particularly, to a process conducive to the enhancement of the photopolymerization process yield by the use of different irradiation sources.

2. Description of Related Art

In general, printed circuit boards each have insulating layers and circuit layers. A portion of the insulating layers and a photoresist layer whereby copper foil is patterned to become a circuit are made of photopolymerization materials (existing in the form of photopolymerization layers). The photopolymerization layers are patterned by exposure and development.

Conventional photopolymerization layers are covered with masks, then exposed and finally patterned. The photopolymerization layers are in uncured or semi-cured status prior to exposure, thus masks are contaminated with ambient particles after several instances of use. The contamination takes place at the mask areas otherwise intended for exposure. Exposure-related areas of the photopolymerization layers are intended for exposure but are hidden by the particles and thus not irradiated. As a result, unnecessary pores are formed in the photopolymerization layers in the course of subsequent development. Furthermore, the photopolymerization layers covered with the masks are likely to be compressed and damaged by the masks. For the aforesaid reasons, the prior art has a longtime drawback: the use of masks has a negative effect on the patterning-related yield.

To overcome the aforesaid drawback, maskless lithography is becoming more popular. A digital micro-lens device (DMD) operates in conjunction with a UV source to perform direct imaging (DI), such that the digital micro-lens device controls the extent of exposure without using any mask, so as to pattern a photopolymerization layer. However, the joint operation of the DMD and the UV source has an obvious drawback: the DMD is unable to tolerate overly high energy (otherwise its heat dissipator may be overloaded), and thus the power of the UV source must not be overly high. To provide to the photopolymerization layer the energy required for polymerization, the UV source has to supply energy to the photopolymerization layer in a low-power, high-frequency manner. However, if the photopolymerization layer is too thick (for example, as with solder resist layer) or is even colored (with low transmittance), low-power UV cannot reach the photopolymerization layer's bottom to cure it sufficiently, thereby causing severe overcut to the development and windowing edges in the course of subsequent development and windowing.

Therefore, it is worth solving or at least mitigating all the aforesaid problems.

BRIEF SUMMARY OF THE INVENTION

In view of the aforesaid drawbacks of the prior art, it is an objective of the present disclosure to provide a manufacturing process effective in overcoming the aforesaid drawback, i.e., a mask's negative effect on patterning-related yield and capability of processing a thick photopolymerization layer.

In order to achieve the above and other objectives, the present disclosure provides a method for exposing a photopolymerization layer comprising photopolymers, with the steps of:

providing a printed circuit board, with a photopolymerization layer disposed on the top side of the printed circuit board;

performing first-instance exposure on the photopolymerization layer, using a UV source and a digital micro-lens device, wherein the energy provided by the UV source during the first-instance exposure is less than the exposure energy required for complete curing of the photopolymerization layer, and the UV source is of power less than 0.2 kW;

stopping the first-instance exposure;

covering the photopolymerization layer with a mask, with the mask having a bottom side in contact with the photopolymerization layer; and performing second-instance exposure on the photopolymerization layer, using a mercury lamp and the mask, wherein energy provided by the mercury lamp during the second-instance exposure is no less than the difference between the exposure energy required for the complete curing of the photopolymerization layer and the energy provided during the first-instance exposure, and the mercury lamp is of a power greater than 5 kW.

The use of a low-power UV source in the first-instance exposure has two advantages: curing begins from the top side of the photopolymerization layer; and the digital micro-lens device need not to be in contact with the photopolymerization layer, thereby precluding particle-related contamination and compressive damage otherwise caused to the uncured/semi-cured photopolymerization layer. The use of a high-power mercury lamp in the second-instance exposure has the advantages described below. First, the high power of the mercury lamp is sufficient to enable the bottom of the thick photopolymerization layer to be completely cured. Second, since the top of the photopolymerization layer has been cured by the first-instance exposure, particles adsorbed by any areas intended for the second-instance exposure neither lead to the formation of pores in the course of subsequent development (because the cured top of the photopolymerization layer serves a protective purpose) nor cause compressive damage to the cured top of the photopolymerization layer. Therefore, the present disclosure overcomes the longtime drawback of mask-based patterning. It provides a photopolymer patterning process that is satisfactory, especially in the presence of a thick conventional solder resist layer, and offers a cost-effective alternative solution to maskless lithography.

DETAILED DESCRIPTION OF THE PREFERRED EMBODIMENTS

Figure 1:
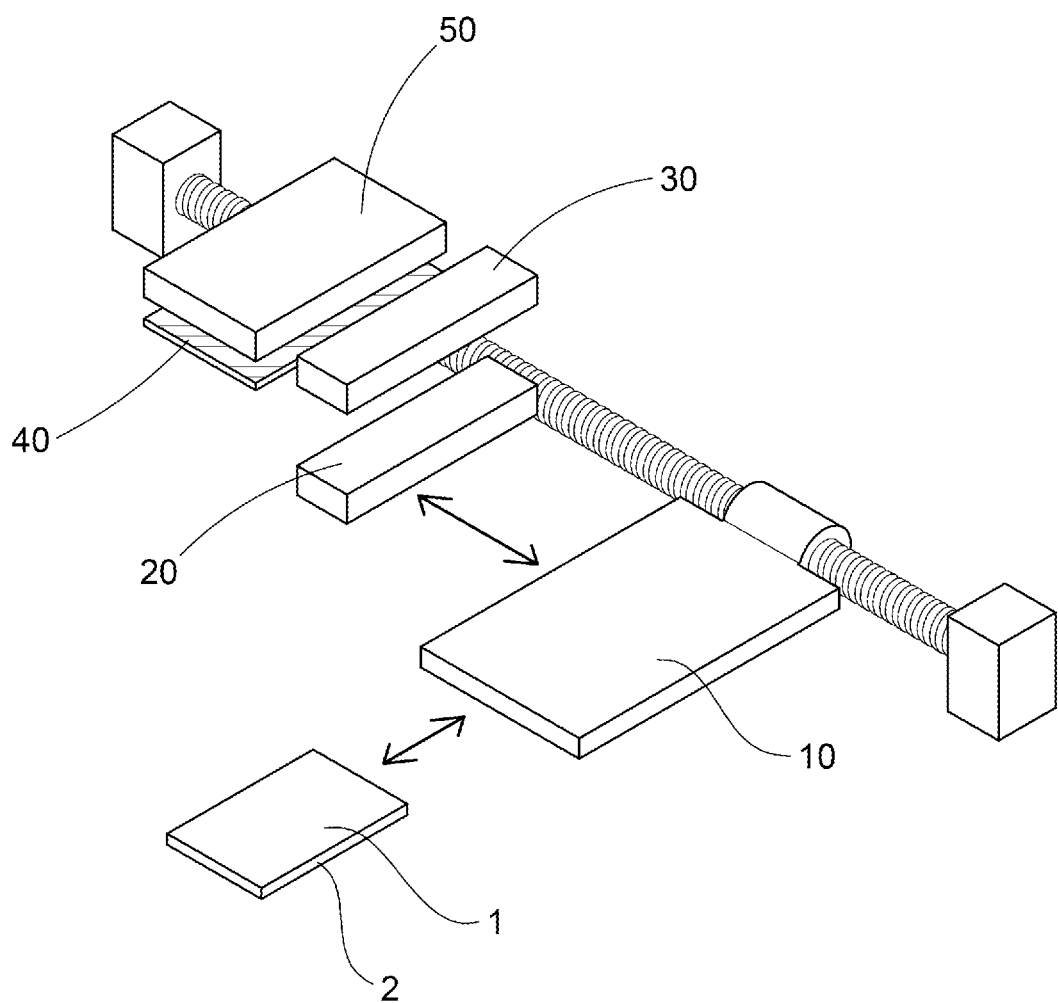
FIG. 1 is a schematic view of an exposure apparatus according to the first embodiment of the present disclosure.
Figure 2:
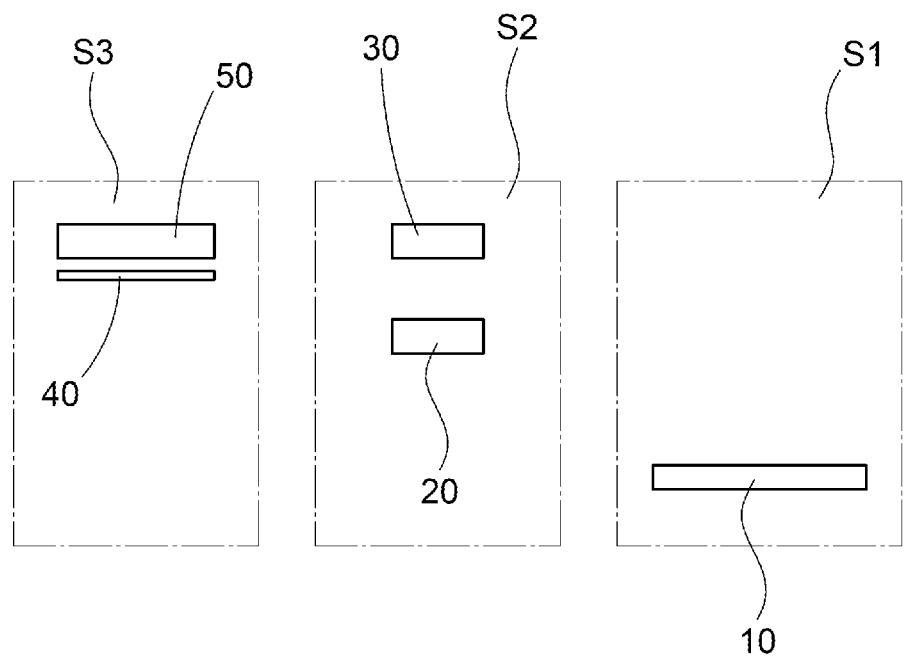
FIG. 2 is a schematic lateral view of the exposure apparatus according to the first embodiment of the present disclosure, omitting some components.

Referring to FIGS. 1, 2, the first embodiment of the present disclosure provides an exposure apparatus for use in the exposure and polymerization of a photopolymerization layer of a printed circuit board to pattern the photopolymerization layer. The printed circuit board is a monolayer board structure or multilayer composite board structure, for example, a carrier board for a flexible printed circuit (FPC) or printed circuit board (PCB), and is made of materials including but not limited to, polyethylene terephthalate (PET), any other polyester film, polyimide film, polyamide-imide film, polypropylene film and polystyrene film. The photopolymerization layer is a layered structure made of photopolymers. After being irradiated, the photopolymers undergo polymerization and thus become cured. The photopolymerization layer is, for example, a dielectric layer of a printed circuit board, a photoresist layer required for patterning copper foil or opaque solder resist ink. The exposure apparatus in this embodiment comprises a first working region S1, a second working region S2, a third working region S3, a conveying platform 10, a digital micro-lens device 20, a UV source 30, a mask 40 and a mercury lamp 50.

The conveying platform 10 carries a printed circuit board 2. A photopolymerization layer 1 is disposed on the top side of the printed circuit board 2. The conveying platform 10 is predetermined to lie in the first working region S1. When the conveying platform 10 lies in the first working region S1, the printed circuit board 2 is moved to the conveying platform 10 by hand or with an automated apparatus. When the conveying platform 10 is in operation, the printed circuit board 2 carried by the conveying platform 10 is moved from the second working region S2 to the third working region S3 with a screw mechanism or any other displacement mechanism. In an embodiment, upon completion of exposure and polymerization of the photopolymerization layer 1, the conveying platform 10 returns to the first working region S1 and moves the printed circuit board 2 out of the conveying platform 10 by hand or with an automated apparatus.

The digital micro-lens device 20 is disposed in the second working region S2. The digital micro-lens device 20 has therein micro-lenses and uses a control signal to control each micro-lens to flip over to become a speedy digital optical switch for controlling whether or not a light beam can pass through the digital micro-lens device 20. Therefore, the digital micro-lens device 20 is capable of performing patterning, exposure and polymerization on the photopolymerization layer 1.

The UV source 30 is disposed in the second working region S2 and has UV lamps capable of triggering photopolymers to undergo polymerization. When the UV source is of high power, the UV source is likely to cause damage to the digital micro-lens device 20; thus, the power of the UV source 30 is less than 0.2 kW or even less than 0.1 kW. The UV source 30 performs first-instance exposure on the photopolymerization layer 1 with the digital micro-lens device 20 while the conveying platform 10 is passing the second working region S2.

The mask 40 covers the photopolymerization layer 1, with its bottom side being in contact with the photopolymerization layer 1, as soon as the conveying platform 10 moves to the third working region S3. The mask 40 is placed in a mask frame and undergoes displacement through an automated apparatus. In an embodiment, different masks are selected according to the expansion-contraction value of respective printed circuit boards or any other factors, and the masks are changed by hand or with an automated apparatus.

The mercury lamp 50 is disposed in the third working region S3 and adapted to perform the second-instance exposure on the photopolymerization layer 1 through the mask 40 after the photopolymerization layer 1 has been covered with the mask 40. In this embodiment, the power of the mercury lamp 50 is greater than 5 kW to ensure sufficient exposure of the bottom of the photopolymerization layer 1.

A method for exposing a photopolymerization layer comprising photopolymers according to the present disclosure is described below.

Figure 3:
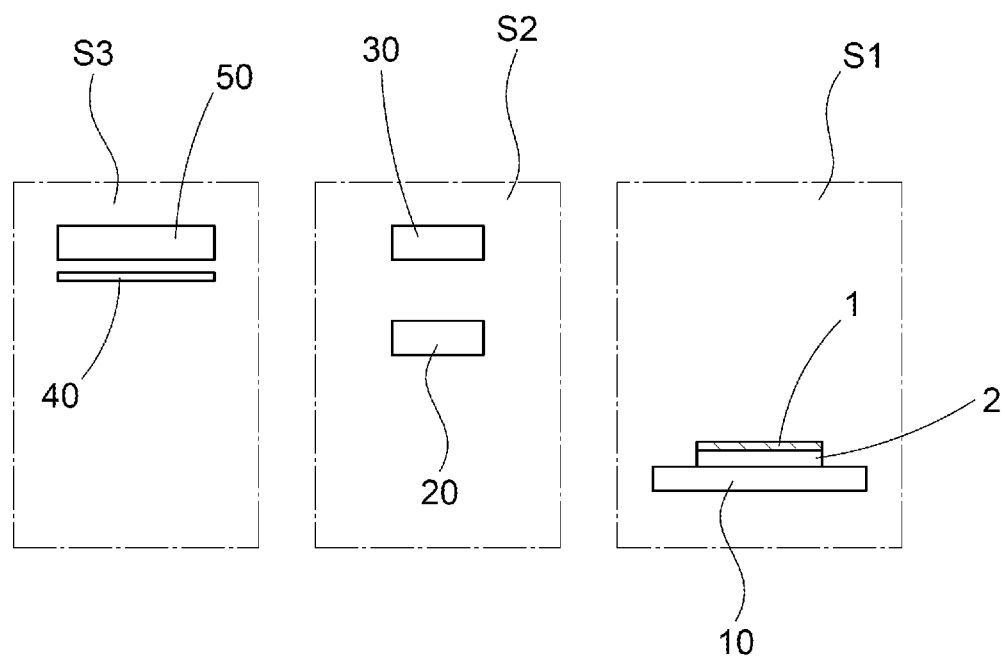
FIG. 3 through FIG. 5 are schematic views of a process flow of implementing the exposure apparatus according to the first embodiment of the present disclosure.

First, the printed circuit board 2 is provided. The photopolymerization layer 1 is disposed on the top side of the printed circuit board 2. Photopolymer paste is directly coated onto the printed circuit board 2 to form the photopolymerization layer 1 thereon. Alternatively, the photopolymers are prepared to take on the form of dry film and then laminated against the top side of the printed circuit board 2 to form the photopolymerization layer 1. After the photopolymerization layer 1 has been formed, the printed circuit board 2 is moved to the conveying platform 10 in the first working region S1 by hand or with an automated apparatus, as shown in FIG. 3.

Figure 4:
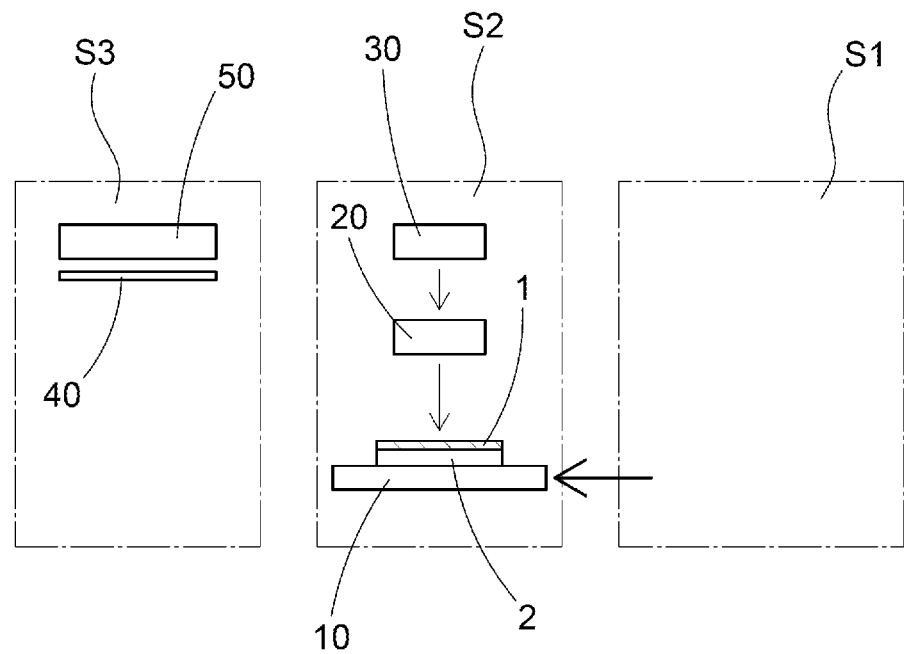

Referring to FIG. 4, the conveying platform 10 moves from the first working region S1 to the second working region S2. Then, the UV source 30 performs first-instance exposure on the photopolymerization layer 1 through the digital micro-lens device 20. The energy provided by the UV source 30 during the first-instance exposure is less than the exposure energy required for the complete curing of the photopolymerization layer 1. Preferably, the energy provided by the UV source 30 during the first-instance exposure is less than half of the exposure energy required for the complete curing of the photopolymerization layer 1 to reduce the duration of the first-instance exposure. After the first-instance exposure, at least the top of the photopolymerization layer is cured.

Then, the first-instance exposure is stopped, such that the conveying platform 10 proceeds to the third working region S3.

Figure 5:
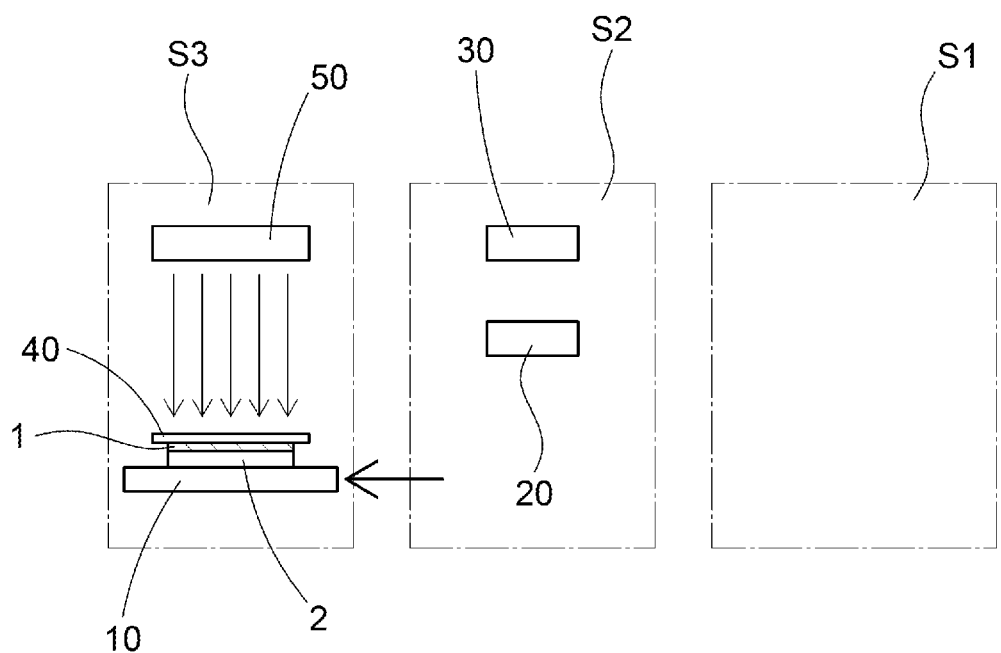

Next, referring to FIG. 5, the photopolymerization layer 1 is covered with the mask 40 and the bottom side of the mask 40 is in contact with the photopolymerization layer 1. Since the top side of the photopolymerization layer 1 has been cured at the end of the first-instance exposure and thus is unlikely to be subjected to compressive damage inflicted by the mask 40. Furthermore, no particles of the photopolymerization layer 1 are adsorbed to the mask 40.

Finally, the mercury lamp 50 performs second-instance exposure on the photopolymerization layer 1 through the mask 40. The energy provided by the mercury lamp 50 during the second-instance exposure is no less than the difference between the exposure energy required for the complete curing of the photopolymerization layer 1 and the energy provided during the first-instance exposure. Since the mercury lamp 50 is of a power greater than 5 kW, even the photopolymers at the bottom of the photopolymerization layer 1 can be completely cured (even the bottom of the photopolymerization layer 1 has a maximum thickness of no less than 20 μm), thereby precluding severe overcut otherwise likely to occur to the photopolymerization layer 1 in the course of subsequent development and windowing. In an embodiment, upon completion of the second-instance exposure, the printed circuit board 2 may be moved right out of the third working region S3.

Figure 6:
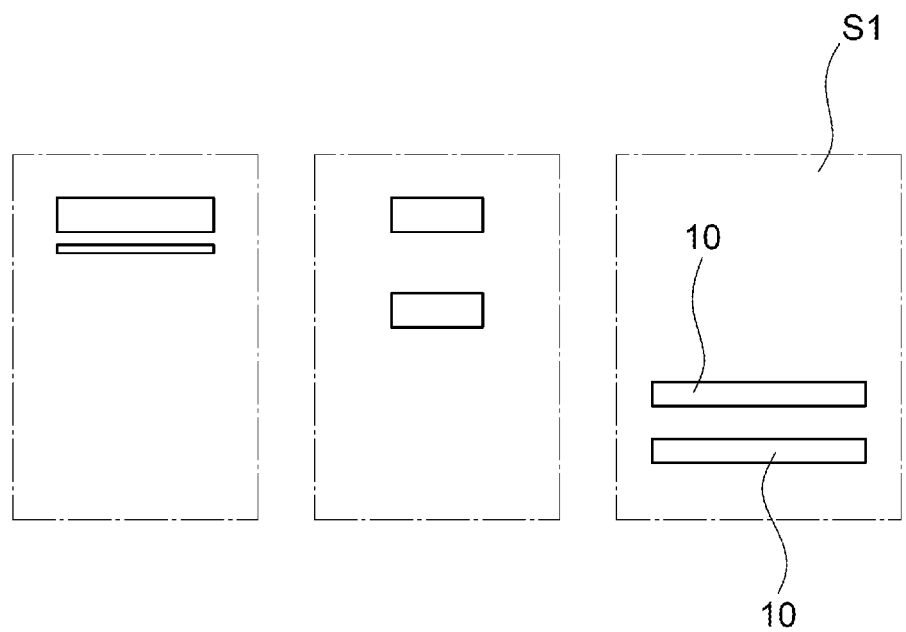
FIG. 6 is a schematic lateral view of the exposure apparatus according to the second embodiment of the present disclosure, omitting some components.

FIG. 6 illustrates the second embodiment of the exposure apparatus with distinguishing technical features (when compared with the first embodiment of the exposure apparatus) as follows: two conveying platforms 10 are provided; one of the conveying platforms 10 moves a printed circuit board in and out while the other conveying platform 10 is moving within the second and third working regions; and the two conveying platforms 10 alternately convey the printed circuit boards within the first, second and third working regions.

What is claimed is:

1. A method for exposing a photopolymerization layer comprising photopolymers, comprising the steps of:
    providing a printed circuit board, with a photopolymerization layer disposed on the top side of the printed circuit board;
    performing first-instance exposure on the photopolymerization layer, using a UV source and a digital microlens device, wherein energy provided by the UV source during the first-instance exposure is less than exposure energy required for the complete curing of the photopolymerization layer, and the UV source is of a power less than 0.2 kW;
    stopping the first-instance exposure;
    covering the photopolymerization layer with a mask, with the mask having a bottom side in contact with the photopolymerization layer; and
    performing second-instance exposure on the photopolymerization layer, using a mercury lamp and the mask, wherein energy provided by the mercury lamp during the second-instance exposure is no less than the difference between the exposure energy required for the complete curing of the photopolymerization layer and the energy provided during the first-instance exposure, and the mercury lamp is of a power greater than 5 kW.

2. The method for exposing a photopolymerization layer comprising photopolymers of claim 1, wherein the energy provided by the UV source during the first-instance exposure is less than half of the exposure energy required for the complete curing of the photopolymerization layer.

3. The method for exposing a photopolymerization layer comprising photopolymers of claim 1, wherein the power of the UV source is less than 0.1 kW.

4. The method for exposing a photopolymerization layer comprising photopolymers of claim 1, the wherein maximum thickness of the photopolymerization layer is no less than 20 μm.

5. The method for exposing a photopolymerization layer comprising photopolymers of claim 1, wherein the photopolymerization layer is opaque solder resist ink.

* * * * *